US008569845B2

(12) United States Patent
Huang et al.

(10) Patent No.: US 8,569,845 B2
(45) Date of Patent: Oct. 29, 2013

(54) STRAINED SILICON DEVICE (75) Inventors: Chien-Chao Huang, Hsin-chu (TW);
Cheng-Chuan Huang, Taipei (TW);
Fu-Liang Yang, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 11/549,002

(22) Filed: Oct. 12, 2006

(65) Prior Publication Data
US 2007/0075356 A1 Apr. 5, 2007

Related U.S. Application Data

(62) Division of application No. 10/937,722, filed on Sep. 9, 2004, now Pat. No. 7,135,372.

(51) Int. Cl.
*H01L 21/02* (2006.01)
(52) U.S. Cl.
USPC .................. 257/408; 257/344; 257/E29.266
(58) Field of Classification Search
USPC ........... 257/213, 344, 408, E29.266; 438/303
See application file for complete search history.

(56) References Cited

U.S. PATENT DOCUMENTS

| 5,015,598 | A | * | 5/1991 | Verhaar | 438/304 |
|---|---|---|---|---|---|
| 5,079,180 | A | | 1/1992 | Rodder et al. | |
| 5,290,720 | A | * | 3/1994 | Chen | 438/304 |
| 5,891,769 | A | * | 4/1999 | Liaw et al. | 438/167 |
| 6,023,082 | A | | 2/2000 | McKee et al. | |
| 6,130,123 | A | | 10/2000 | Liang et al. | |
| 6,187,642 | B1 | | 2/2001 | Yu et al. | |
| 6,316,297 | B1 | * | 11/2001 | Matsuda | 438/174 |
| 6,346,447 | B1 | | 2/2002 | Rodder | |
| 6,429,061 | B1 | | 8/2002 | Rim | |
| 6,489,206 | B2 | * | 12/2002 | Chen et al. | 438/300 |
| 6,495,402 | B1 | * | 12/2002 | Yu et al. | 438/149 |
| 6,498,067 | B1 | * | 12/2002 | Perng et al. | 438/305 |
| 6,573,172 | B1 | * | 6/2003 | En et al. | 438/626 |
| 6,680,240 | B1 | | 1/2004 | Maszara | |
| 6,689,688 | B2 | | 2/2004 | Besser et al. | |
| 6,696,346 | B2 | | 2/2004 | Hayashizaki | |
| 6,699,755 | B1 | | 3/2004 | Chiou et al. | |
| 6,723,609 | B2 | * | 4/2004 | Yang et al. | 438/303 |

(Continued)

OTHER PUBLICATIONS

Jiang, J.Z., et al., "Compressibility and Thermal Expansion of Cubic Silicon Nitride", The American Physical Society, Physical Review B. vol. 65, 161202(R), 2002, pp. 161202-1-161202-4.

(Continued)

*Primary Examiner* — Robert Huber
(74) *Attorney, Agent, or Firm* — Haynes and Boone, LLP (57) ABSTRACT

A method of manufacturing a microelectronic device includes forming a p-channel transistor on a silicon substrate by forming a poly gate structure over the substrate and forming a lightly doped source/drain region in the substrate. An oxide liner and nitride spacer are formed adjacent to opposing side walls of the poly gate structure and a recess is etched in the semiconductor substrate on opposing sides of the oxide liner. Raised SiGe source/drain regions are formed on either side of the oxide liner and slim spacers are formed over the oxide liner. A hard mask over the poly gate structure is used to protect the poly gate structure during the formation of the raised SiGe source/drain regions. A source/drain dopant is then implanted into the substrate including the SiGe regions.

20 Claims, 5 Drawing Sheets

(56) References Cited

U.S. PATENT DOCUMENTS

| | | |
|---|---|---|
| 6,812,103 B2 | 11/2004 | Wang et al. |
| 6,929,992 B1 | 8/2005 | Djomehri et al. |
| 7,112,497 B2 * | 9/2006 | Mehrad et al. ................ 438/303 |
| 2002/0135015 A1 | 9/2002 | Chen et al. |
| 2003/0104645 A1 | 6/2003 | Weon et al. |
| 2003/0234422 A1 | 12/2003 | Wang et al. |
| 2005/0035409 A1 * | 2/2005 | Ko et al. ........................ 257/350 |

OTHER PUBLICATIONS

Wilson, Ron, "Analysis: MOSFET Workhorse Due for Overhaul", CMP Media, LLC, 2003, 3 pages.

Tarraf, A., et al., "Stress Investigation of PECVD Dielectric Layers for Advanced Optical MEMS", Journal of Micromechanics and Microengineering, vol. 14, Nov. 18, 2003, pp. 317-323.

Maszara, W.P., et al., "SOI and Strain: CMOS Performance Enhancers", Solid State Technology, Aug. 2003, 5 pages.

* cited by examiner

STRAINED SILICON DEVICE

CROSS-REFERENCE

This application is a divisional of U.S. patent application Ser. No. 10/937,722 filed Sep. 9, 2004, and entitled, "A Strained Silicon Device Manufacturing Method," which is hereby incorporated by reference in its entirety. Also, this application is related to U.S. patent Ser. No. 10/810,950, filed Mar. 25, 2004, the disclosure of which is hereby incorporated by reference.

BACKGROUND

An integrated circuit (IC) is formed by creating one or more devices (e.g., circuit components) on a semiconductor substrate using a fabrication process. As fabrication processes and materials improve, semiconductor device geometries continue to decrease in size since such devices were first introduced several decades ago. For example, current fabrication processes are producing devices having feature geometry sizes (e.g., the smallest component (or line) that may be created using the process) of less than 90 nm. However, the reduction in size of device geometries frequently introduces new challenges that need to be overcome.

As microelectronic device geometries are scaled below 65 nm, the electrical efficiency becomes an issue that impacts device performance. Microelectronic device performance such as current gain can be significantly affected by the configuration and materials comprising incorporated into microelectronic devices. Therefore, there is an inherent conflict with the configuration and/or the materials used in many of today's microelectronic devices.

Accordingly, what is needed in the art is a microelectronic device and method of manufacture thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the present invention. Specific components and arrangements are described below to simplify the present disclosure by way of example, and are not intended to be limiting. In addition, the present disclosure may repeat reference numerals and/or letters in the various examples. This repetition is for the purpose of simplicity and clarity and does not in itself dictate a relationship between the various embodiments and/or configurations discussed, nor does it dictate that the referenced component is identical to others with the same reference numeral. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
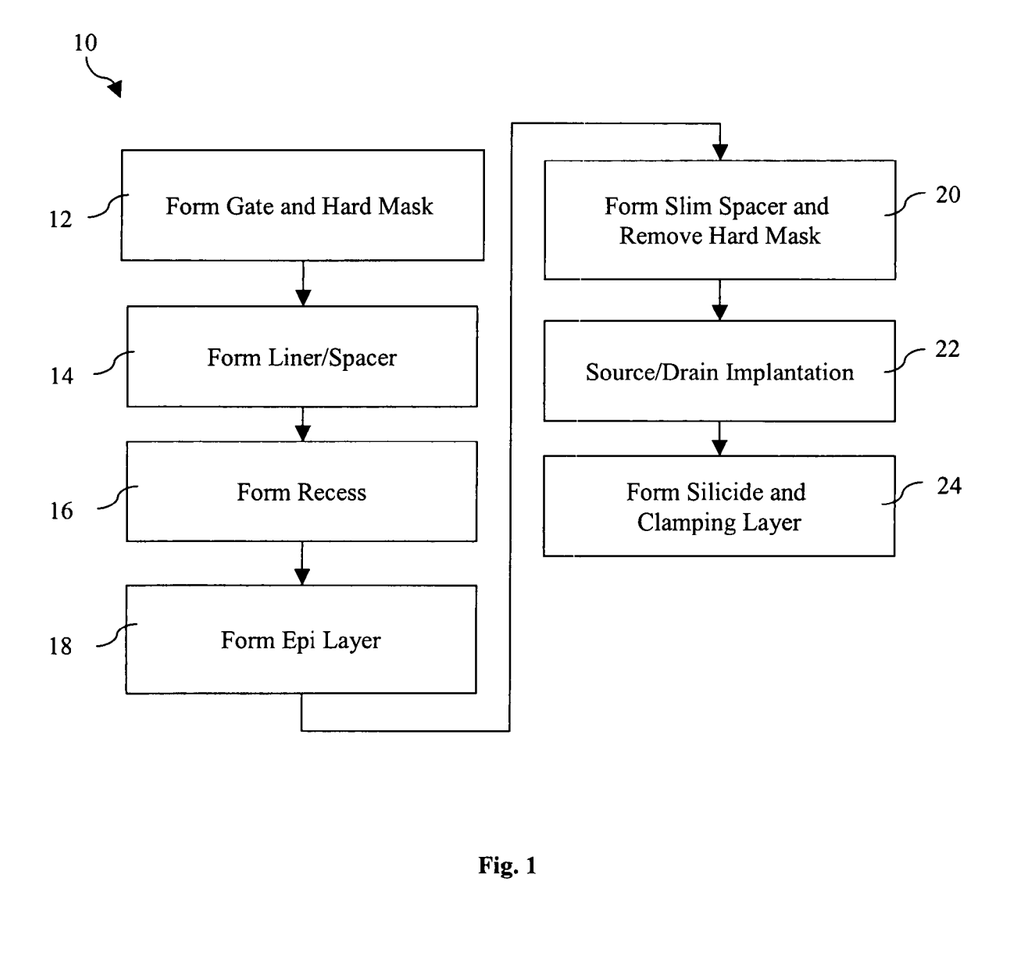
FIG. 1 is a flowchart of one embodiment of a method for performing one or more embodiments of the present disclosure.

Referring to Referring to FIG. 1, illustrated a method 10 can be used for manufacturing a microelectronic device according to one or more embodiments of the present invention. For the sake of example, the method 10 will be described with reference to the manufacture of a semiconductor integrated circuit 100, illustrated in FIGS. 2-8. The manufacturing method 10 can be used for the formation of a "graded junction" source/drain doped region in a semiconductor microelectronic device such as a transistor. It is understood that the method 10 can represent only a portion of a process flow, and it is further understood that in some embodiments, certain steps of the method may be rearranged or not performed altogether.

Figure 2:
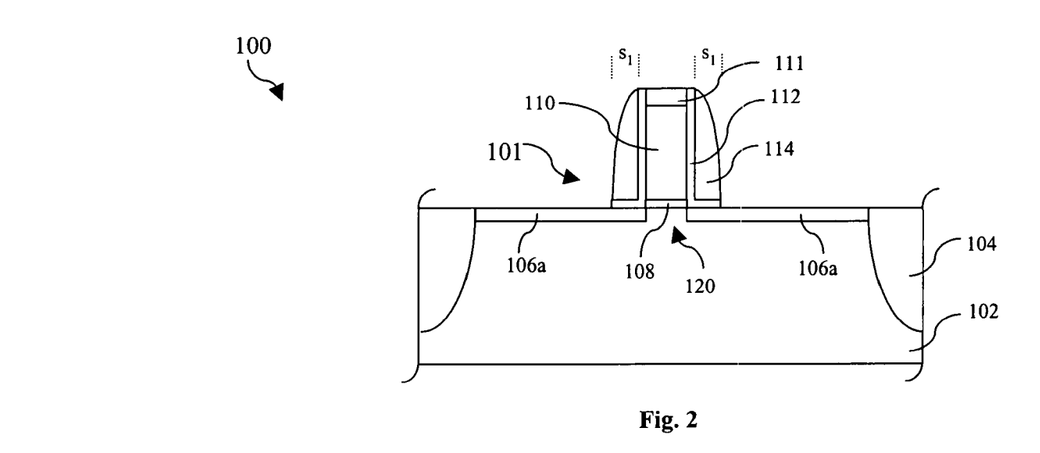
FIGS. 2-7 are sectional views of a portion of a microelectronic device constructed according to the method of FIG. 1.

Referring also to FIG. 2, in the present example, the method 10 begins at step 12 for creating a microelectronics device 101. The device 101 includes a substrate 102, isolation regions 104, a gate layer 108, an electrode 110, and a hard mask 111.

The substrate 102 may be a semiconductor substrate, such as one including silicon. The isolation regions 104 may include silicon dioxide ($SiO_2$), silicon nitride ($Si_xN_y$), silicon carbide (SiC), low-k dielectric, and/or other materials. In one embodiment, the isolation regions 104 may be created by etching or otherwise forming a recess in the substrate 102 and subsequently filling with one or more layers of a dielectric.

The gate layer 108, which may be gate oxide, is formed followed by the formation of the bulk gate electrode 110, which may include a layer of polysilicon. In the present example, a hard mask layer 111 resides over the gate electrode 110. The hard mask layer 111 is about 250 Angstroms in thickness (height, as shown in FIG. 2), and may include silicon nitride ($Si_xN_y$), silicon dioxide ($SiO_2$), silicon oxynitride (SiON), photoresist, and/or other materials.

At step 14, doped regions 106a are formed in the substrate 102. In the present embodiment, the doped regions 106a are lightly doped drain/source (LDD) regions that are implanted relatively shallow into the substrate 102. The LDD regions 106a can be created by CVD, PECVD, ALD, ion implantation, and/or other processing techniques. For example, the doped regions 106a may be formed by growing a sacrificial oxide on the substrate 102, opening a pattern for the location of the doped regions 106a and then using a chained-implantation procedure. Alternatively, the doped regions 106a may be formed by selective epitaxial growth (SEG).

For the sake of example, the doped regions 106a include P-type impurities such as boron, boron fluoride, indium, and/or other materials. Formation of the P-type doped regions may include one or more diffusion, annealing, and/or electrical activation processes. A channel region 120 is thereby formed between the two doped regions 106a. Continuing with the present example, the channel region 120 is a P-channel.

Liners 112 are then formed on the vertical (as illustrated in FIG. 2) sides of the gate electrode 110. In the present embodiment, the liners 112 are L-shaped and include an oxide dielectric layer formed by CVD, PVD, ALD, PECVD, SEG, and/or other processing techniques. Spacers 114 are then formed on the sidewalls of the liners 112. In the present embodiment, the spacers 114 are nitrogen based insulators, such as silicon nitride ($Si_xN_y$). In alternate embodiments, the spacers 114 may include silicon oxide ($SiO_2$), photoresist, and/or other polymers. In the present embodiment, the spacers 114 and the lower portion of the liners 112 are relatively wide, with a width $s_1$ of about 650 Angstroms.

Figure 3:
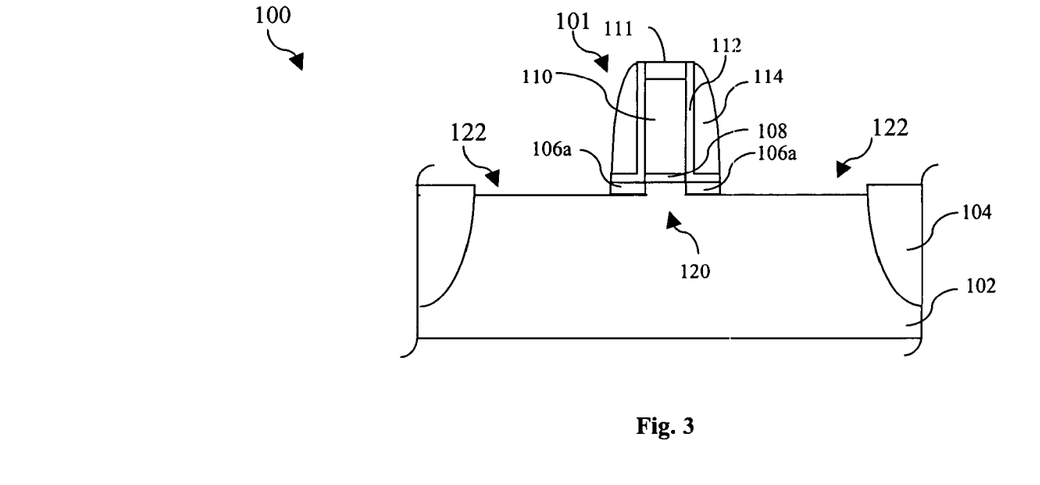

Referring also to FIG. 3, at step 16 (of FIG. 1), silicon recesses 122 are formed on either side of the spacers 114. In the present example, selected portions of the doped regions 106a are removed. The portions of the doped regions 106a located under the liners 112 and spacers 114 remain following the removal of the exposed portions of the doped regions 106a. The exposed portions of the doped regions 106a may be removed by silicon etch, chemical etch, plasma etch, or other appropriate method.

Figure 4:
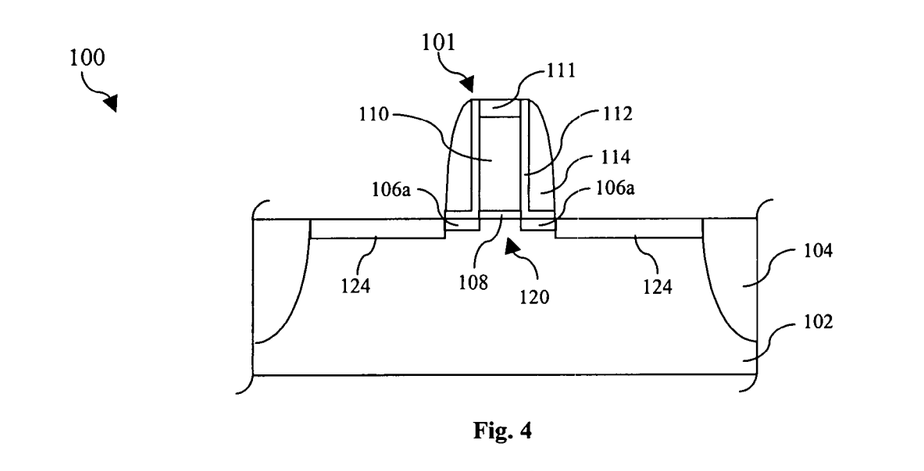

Referring also to FIG. 4, at step 18 (of FIG. 1), an epi layer 124 is formed in the recesses 122 of FIG. 3 between the doped regions 106a and the isolation regions 104. The epi layer 124 may include silicon germanium (SiGe). Other embodiments include silicon carbide (SiC), and/or other epi materials. It is noted that in the present embodiment, SiGe does not accumulate on the hard mask 111 or on the spacers 114. The epi layer 124 is used to make the microelectronic device 101 a "strained silicon" device.

Figure 5:
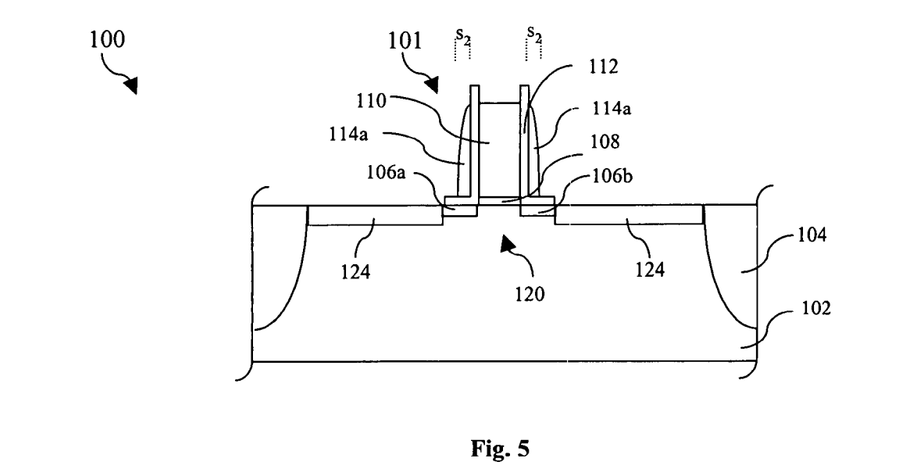

Referring also to FIG. 5, at step 20 (of FIG. 1), the spacers 114 are partially etched, forming "slim" spacers herein designated with the reference numeral 114a. The slim spacers 114a are shown having a width $s_2$, which is less than the width $s_1$ (FIG. 2). The width $s_2$ of the slim spacers 114a may be on the order of about 350 Angstroms. As a result, the lower portion of the liners 112 extend about 300 Angstroms (650–350=300 Angstroms) beyond the slim spacers 114a. The slim spacers 114a may be formed by chemical etch, dry etch, plasma etch, and/or other processing techniques. In one embodiment, the slim spacers 114a are formed by a wet etch of phosphoric acid ($H_3PO_4$).

The hard mask 111 is also removed, either at the same time that the slim spacers 114a are formed, or at a different time. The hard mask 111 may be removed by chemical etch, plasma etch, and/or other techniques. For example, the hard mask 111 may be removed by plasma etch, which may include an environment having reactants such as hydrochloric acid (HCl), hydrogen bromide (HBr), sulfur dioxide ($SO_2$), sulfur hexafluoride ($SF_6$), perfluorocarbons, and/or other gases.

Figure 6:
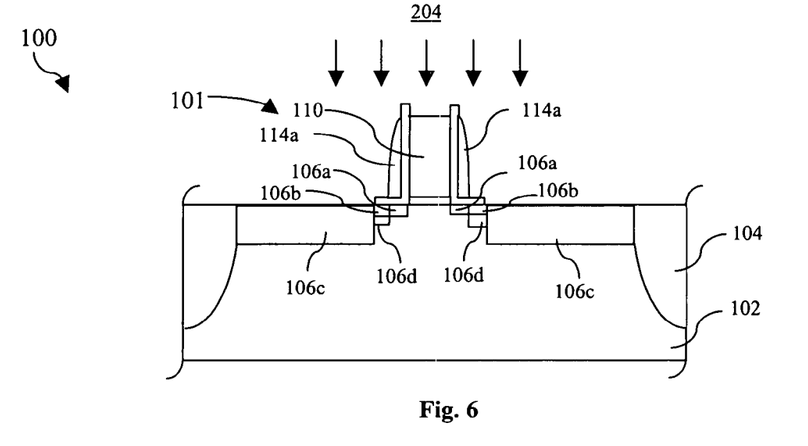

Referring also to FIG. 6, at step 22 (of FIG. 1), the doped regions 106b are treated by a source drain implant 204. The implant 204 may include ion implantation by conventional ion beam, plasma source ion immersion, plasma source ion implantation, and/or other processing techniques. In the present embodiment, the implant 204 may include P-type impurities. In other embodiments, the implant 204 may include impurities such as phosphorous, boron, antimony, arsenic, carbon, germanium, and/or other materials. In furtherance of the present example, the implant is heavier doped than the implant used to create the doped regions 106a. It is understood that different dopants and/or different dopant concentrations can be used, as desired. Alternatively, the implant 204 may utilize thermal diffusion and/or formation of the doped regions 106c by SEG, CVD, PVD, ALD, and/or other processing techniques.

The implant 204 is used to form a graded junction, which is illustrated by the creation of doped regions 106a, 106b, 106c and 106d. The doped region 106b is a combination of the prior process used to create doped region 106a and the implant 204. If the prior process and the implant 204 use similar dopants, the doped region 106b can be comparatively heavier doped than the region 106a. If dissimilar dopants are used, the doped region 106b can have a unique combination from the two process steps.

Figure 8:
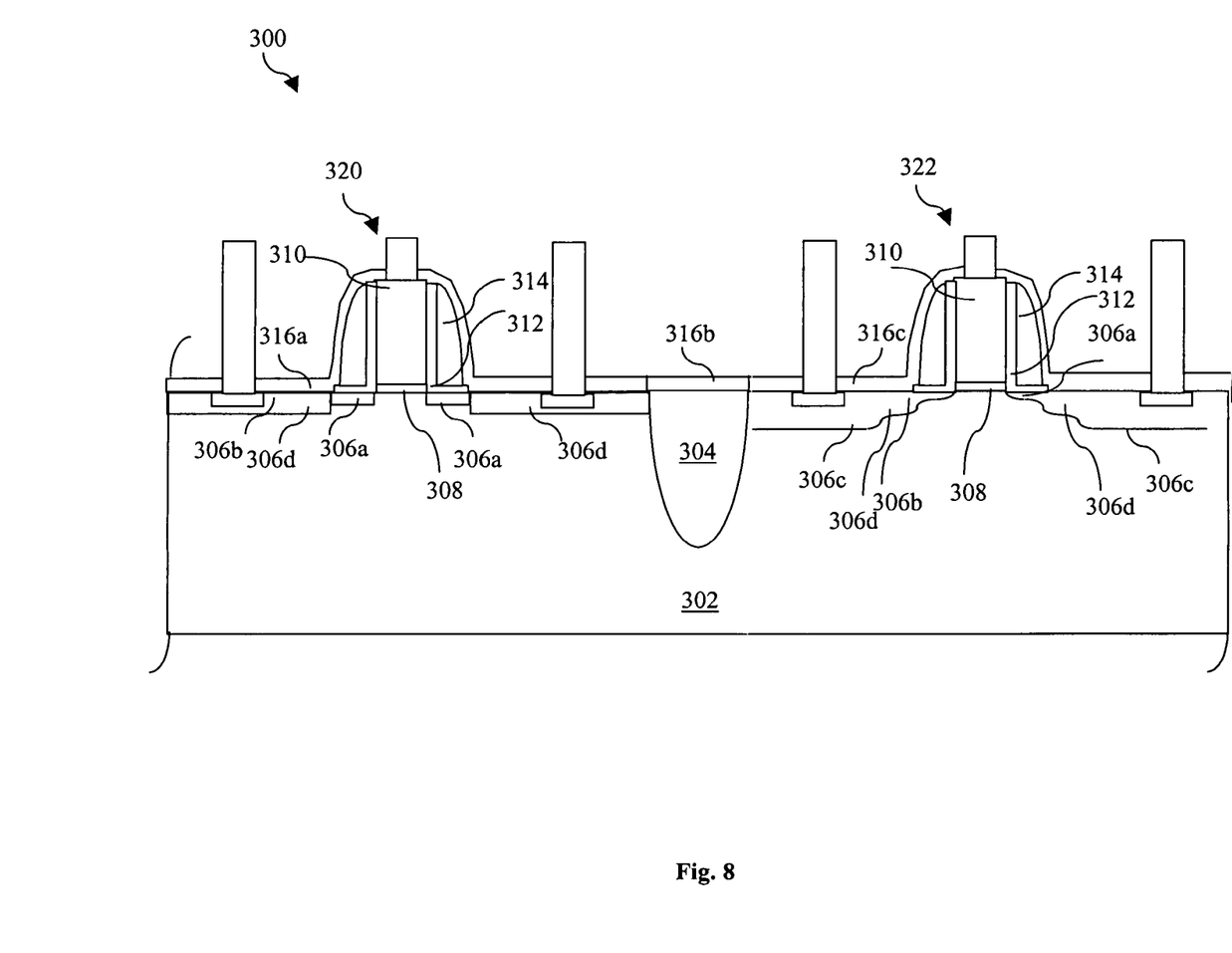
FIG. 8 is a sectional view of one embodiment of a microelectronic integrated circuit constructed according to aspects of the present disclosure.

The doped region 106d, in the present example, is deeper than the previous doped region 106a of FIG. 5. In one embodiment, the implant 204 uses similar dopants of the prior process used to create doped region 106a. In this embodiment, the doped region 106d provides a deeper grading affect. It is understood that although the grading effect is shown as a stair step in FIG. 6, in actuality the grading effect may be more gradual, or smoothed, as shown in FIG. 8.

The doped region 106c is created by the implant 204 on the epi layer 124. In the present example, the SiGe layer 124 allows the implant 204 to go deeper than that of the doped region 106d. Furthermore, the resulting properties of the implant 204 on the SiGe layer 124 may be different than those on the Si substrate 102 used for the doped region 102d. It is understood that in some embodiments, a portion of the implant 204 may extend beyond the epi layer 124 and further into the substrate 102, or in the alternative, may not completely diffuse into the epi layer. It is further understood that although the grading effect is shown as a stair step in FIG. 6, in actuality the grading effect may be more gradual, or smoothed, as shown in FIG. 8.

Figure 7:
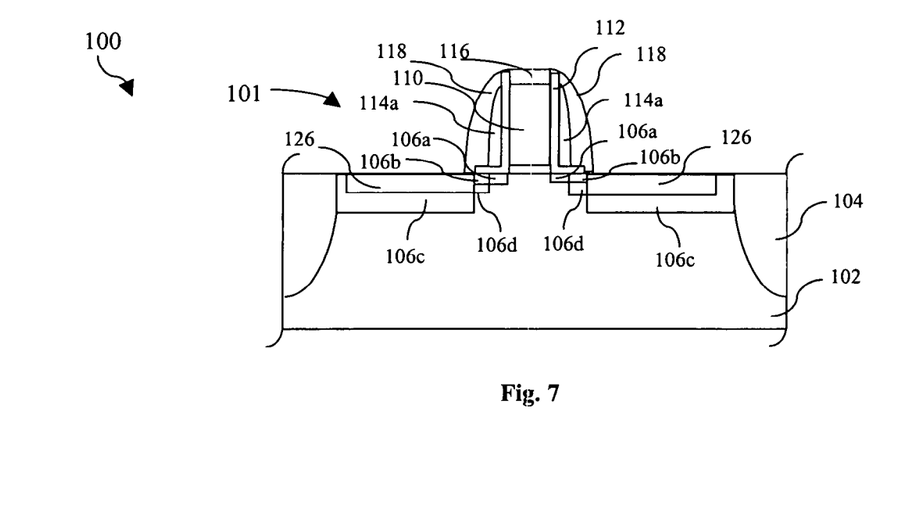

Referring also to FIG. 7, at step 24 (of FIG. 1) connections are provided to the gate, source, and drain of the transistor device 101, and a clamping layer 118 is formed. In the present embodiment, the connections are made through a gate contact 116 and source/drain contacts 126. The gate contact 116 may include a metal silicide such as cobalt silicide ($CoSi_x$), molybdenum silicide ($MoSi_x$), nickel silicide ($NiSi_x$), titanium silicide ($TiSi_x$), and/or other materials. The gate contact 116 may be formed by lithography, chemical etch, plasma etch, CVD, PECVD, ALD, PVD, and/or other processing techniques. Similarly, the source/drain contacts 126 may be include silicide formed in and/or over the doped region 106c. The formation of the gate contact 116 and/or source/drain contacts 126 may also include an anneal process step.

The clamping layer 118 or "contact etch stop layer (CES)" may include openings positioned for the gate contact 116. The clamping layer 118 may include silicon nitride ($Si_xN_y$), silicon dioxide ($SiO_2$), silicon oxy-nitride (SiON), silicon oxy-carbide (SiOC), silicon carbide (SiC), and/or other materials. In some embodiments, the clamping layer 118 may be located over the doped regions 106b and 106c and include openings positioned for the source/drain contacts 126.

The clamping layer 118 may also provide tensile stress and/or compressive stress which may influence the crystalline stress of the channel region 120. The tensile stress of the clamping layer 118 may be controlled by the process parameters during the formation of the clamping layer 118. Compressive stress may be induced into the clamping layer 118 and may also be controlled by the process parameters. In one embodiment, the clamping layer 118 compressive and/or tensile stress may also be adjusted by temperature, process gas flows, nitrogen content, and/or other process related parameters.

Upon completion of step 24 (of FIG. 1), subsequent processing may be performed to form other features located over the gate contact 116 and the doped regions 106c, which may include the formation of a metal silicide, a barrier layer such as tantalum nitride (TaN) or silicon oxy-carbide (SiOC), interconnects having copper (Cu) or aluminum (Al), low-k dielectric layers, and/or other layers. In one embodiment, the microelectronic device 101 may be annealed thereby forming the "graded junction" between the doped regions 106b, 106a, and 106c (similar to that shown in FIG. 8). The anneal may provide a smooth transition between the impurities of the doped regions 106b, 106a, and 106c.

Referring to FIG. 8, in another embodiment, a complementary microelectronic circuit 300 (also referred to as complementary metal oxide semiconductor (CMOS) circuit) includes a substrate 302, an isolation region 304, microelectronic devices 320 and 322, and clamping layers 316a, 316b, and 316c. The CMOS circuit 300 can by created, in part, by using one or more steps of the method 10 of FIG. 1. It is understood that other steps and/or layers may be created as needed, such is as well known to those of ordinary skill in the art.

The substrate 302 includes may include one or more of silicon, gallium arsenide, gallium nitride, strained silicon, silicon germanium, silicon carbide, carbide, diamond, and/or other materials. The substrate 102 may also include a silicon-on-insulator (SOI) substrate, such as a silicon-on-sapphire substrate, a silicon germanium-on-insulator substrate, or another substrate comprising including an epitaxial semiconductor layer on an insulator layer. The substrate 302 may further include a fully depleted SOI substrate wherein the device active silicon thickness may range between about 200 nm and about 5 nm in one embodiment. In another embodiment, the substrate 302 may include an air gap to provide insulation for the microelectronic device 300. For example, one structure may comprise a "silicon-on-nothing" (SON) structure may be employed, wherein the the microelectronic device 300 includes a thin insulation layer comprising formed by air and/or other insulator.

The isolation regions 304 may include shallow trench isolation (STI), local oxidation of silicon (LOCOS), and/or other electrical isolation features. The isolation regions 104 may include silicon dioxide ($SiO_2$), silicon nitride ($Si_xN_y$), silicon carbide (SiC), low-k dielectric, and/or other materials. In one embodiment, the isolation region(s) 104 may by etching or otherwise forming a recess in the substrate 302 and subsequently filling with one or more layers of a dielectric.

The microelectronic device devices 320, 322 may also include one or more layers or other features contemplated by the microelectronic circuit 300 within the scope of the present disclosure, and may be formed by immersion photolithography, maskless lithography, imprint lithography, SEG, CVD, PVD, PECVD, ALD, Langmuir-Blodgett (LB) molecular assembly, chemical mechanical polishing or chemical mechanical planarization (hereafter referred to as CMP), and/or other processing techniques. Conventional and/or future-developed lithographic, etching and/or other processes may be employed to form the microelectronic device 100.

The microelectronic devices 320 and/or 322 may include an N-type metal oxide semiconductor (NMOS) device and/or P-type metal oxide semiconductor (PMOS) device, respectively. The microelectronic devices 320 and 322 may include portions substantially similar to the discussions above with respect to the microelectronic device 100. For example, gate layer 308, liners 312, spacers 314, and bulk gate electrode 310 may be substantially similar in composition to the gate layer 108, liners 112, spacers 114a, and the bulk gate electrode 110 discussed above.

In the present example, the device 322 was formed using an epi layer at the source/drain region, as is discussed above with reference to FIGS. 4-6. In contrast, the device 320 was not formed using an epi layer as described above. As a result, the device 322 includes a three-step graded formation of the dopant regions 306a, 306b, 306c, and 306d, while the device 320 includes a two-step graded formation of the dopant regions 306a, 306b, and 306d. It is understood that since the devices 320, 322 are not of the same type, different dopants can be used to form the layers 306a-306d, such selection of dopants being well understood by those of ordinary skill in the art.

It is generally understood that different embodiments will see different benefits. For example, in some embodiments, a significant current gain will be observed over prior art devices, as well as a lower junction capacitance. Some prior art devices can only provide higher drive current with a higher junction capacitance. This improvement can occur, in some embodiments, without a significant change in threshold voltage.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. For example, there are many know ways to form a layer or structure, including deposition, diffusion, implantation, etching, growing, and so forth. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronic device, comprising:
   a gate structure overlying a semiconductor substrate and for selectively operating a strained p-channel in the semiconductor substrate; and
   source and drain regions, each comprising:
      a first doped region located adjacent to the channel and extending a first depth into the semiconductor substrate from a top surface of the semiconductor substrate,
      a second doped region located adjacent to the first doped region and adjacent to the channel and extending into the semiconductor substrate a second greater than the first depth,
      a third doped region located adjacent to the second doped region and adjacent to the channel and extending into the semiconductor substrate from the top surface thereof a third depth greater than the second depth,
      a contact formed within the third doped region and adjacent the second doped region,
      wherein no portion of the first, second, and third doped regions lies within the channel, wherein the third doped region includes one of SiGe and SiC and the first and second doped regions are free of SiGe and SiC;
   a clamping layer surrounding at least a portion of the gate structure and over the second doped region;
   an L-shaped dielectric liner having a first portion physically contacting a sidewall of a gate electrode of the gate structure and a second portion extending over the second doped region, wherein the sidewall of the gate electrode extends along an axis that is substantially perpendicular the top surface of the semiconductor substrate; and
   a relatively thin spacer extending over the first doped region and having a first side abutting the first portion of the liner and a second side abutting the second portion of the liner,
   wherein a length of the second portion of the liner is greater than a width of the second side of the spacer such that the second portion of the liner extends further over the second doped region than does the second side of the spacer, wherein the clamping layer extends further over the second doped region away from the gate structure than does the second portion of the liner.

2. The device of claim 1 wherein the source and drain regions are annealed following the formation of the third doped regions.

3. The device of claim 1 wherein the third doped region includes a SiGe doped portion.

4. The device of claim 1 wherein the gate structure includes a silicide contact.

5. The device of claim 1 wherein the first regions are lightly doped source/drain regions.

6. The device of claim 1 wherein the relatively thin spacer has a width of about 350 Angstroms and wherein the second doped region has a width of approximately 300 Angstroms extending from an outer edge of the relatively thin spacer.

7. A microelectronic device, comprising:
a gate structure overlying a strained channel region of a substrate;
a source region having a first doped region, a second doped region, and a third doped region; and
a drain region having a fourth doped region, a fifth doped region, and a sixth doped region, wherein:
the first and fourth doped regions are located on opposing sides of the strained channel and each extends from a top surface of the semiconductor substrate a first depth into the substrate, wherein the fourth doped region has an edge that is closer to the strained channel than any other edge of the fourth doped region, wherein the edge of the fourth doped region is aligned with a sidewall of a gate electrode of the gate structure such that the edge of the fourth doped region and the sidewall of the gate electrode are coplanar;
the second and fifth doped regions are located on opposing sides of the strained channel and each extends a second depth into the substrate that is greater than the first depth;
the third and sixth doped regions are located on opposing sides of the strained channel and each extends from the top surface of the semiconductor substrate a third depth into the substrate that is greater than the second depth;
a clamping layer surrounding at least a portion of the gate structure; and
a contact formed within each of the third and sixth doped regions adjacent the second and fifth doped regions, respectively,
wherein the second and fifth doped regions are more heavily-doped relative to the first and fourth doped regions, and wherein the third and sixth doped regions are more heavily-doped relative to the second and fifth doped regions, and
wherein no portion of the first, second, and third doped regions lies within the channel, wherein the third doped region includes one of SiGe and SiC and the first and second doped regions are free of SiGe and SiC,
a first L-shaped dielectric liner having a first portion abutting a sidewall of the gate structure and a second portion extending over the second doped region, the second portion having a distal most end surface extending over the second doped region and facing away from the sidewall of the gate structure; and
a first relatively thin spacer extending laterally over the first doped region and having a first side abutting the first portion of the first liner and a second side abutting the second portion of the first liner,
wherein a length of the second portion of the first liner is greater than a width of the second side of the first spacer such that the second portion of the first liner extends further over the second doped region than does the second side of the first spacer,
wherein the clamping layer is in physical contact with the distal most end surface of the second portion such that the clamping layer covers the distal most end surface of the second portion.

8. The device of claim 7 wherein the first and fourth doped regions are lightly doped relative to the second, third, fifth, and sixth doped regions.

9. The device of claim 7 further comprising a second L-shaped dielectric liner having a first portion abutting a sidewall of the gate structure and a second portion extending over the fifth doped region.

10. The device of claim 9 further comprising:
a second relatively thin spacer extending laterally over the fourth doped region and having a first side abutting the first portion of the second liner and a second side abutting the second portion of the second liner, wherein a length of the second portion of the second liner is greater than a width of the second side of the second spacer such that the second portion of the second liner extends further over the fifth doped region than does the second side of the second spacer.

11. The device of claim 10 wherein the first and second spacer portions each has a width of about 350 angstroms, and wherein the second and fifth doped regions each have a width of about 300 angstroms.

12. The device of claim 7 wherein the strained channel laterally interposes the first and fourth doped regions, wherein the strained channel and the first and fourth doped regions collectively laterally interpose the second and fifth doped regions, and wherein the strained channel and the first, second, fourth, and fifth doped regions collectively laterally interpose the third and sixth doped regions.

13. A microelectronic device, comprising:
a gate structure overlying a semiconductor substrate and for selectively operating a strained p-channel in the semiconductor substrate;
source and drain regions, each comprising:
a first doped region located adjacent to the channel and extending a first depth into the semiconductor substrate from a top surface of the semiconductor substrate,
a second doped region located adjacent to the first doped region and adjacent to the channel and extending into the semiconductor substrate from the top surface thereof a second depth greater than the first depth,
a third doped region located adjacent to the second doped region and adjacent to the channel and extending into the semiconductor substrate from the top surface thereof a third depth greater than the second depth, and
a contact formed within the third doped region and adjacent the second doped region,
wherein no portion of the first, second, and third doped regions lies within the channel, wherein the third doped region includes one of SiGe and SiC and the first and second doped regions are free of SiGe and SiC;
an L-shaped dielectric liner having a first portion abutting a sidewall of the gate structure and a second portion extending over the second doped region, the second portion have a lower surface facing the second doped region and opposing upper surface facing away from the second doped region;

a clamping layer surrounding at least a portion of the gate structure and in contact with the upper surface of the of the second portion of the L-shaped liner; and a spacer extending over the first doped region and having a first side abutting the first portion of the liner and a second side abutting the second portion of the liner, wherein a length of the second portion of the liner is at least as great as a width of the second side of the spacer such that the second portion of the liner extends at least as far over the second doped region as the second side of the spacer; wherein:

the gate structure includes a silicide contact, wherein the clamping layer physically contacts the silicide contact; and the first regions are lightly doped source/drain regions.

14. The device of claim 1, wherein the clamping layer has an opening through which a gate contact of the gate structure is accessible.

15. The device of claim 1, wherein the first portion of the L-shaped dielectric liner abutting the sidewall of the gate structure is in contact with the clamping layer.

16. The device of claim 1, wherein the first portion of the L-shaped dielectric liner has opposing sidewall surface such that one of the sidewall surfaces abuts the sidewall of the gate structure and the other of the sidewall surfaces is in contact with the clamping layer.

17. The device of claim 1, wherein the second portion of the L-shaped dielectric liner has a lower surface facing the second doped region and opposing upper surface facing away from the second doped region, and wherein the clamping layer is in contact with the upper surface of the second portion of the L-shaped dielectric liner.

18. The device of claim 7, wherein the first portion of the first L-shaped dielectric liner has opposing sidewall surface such that one of the sidewall surfaces abuts the sidewall of the gate structure and the other of the sidewall surfaces is in contact with the clamping layer.

19. The device of claim 7, wherein the second portion of the first L-shaped dielectric liner has a lower surface facing the second doped region and opposing upper surface facing away from the second doped region, and wherein the clamping layer is in contact with the upper surface of the second portion of the first L-shaped dielectric liner.

20. The device of claim 13, wherein the length of the second portion of the liner is greater than a width of the second side of the spacer such that the second portion of the liner extends further over the second doped region than does the second side of the spacer.

* * * * *